United States Patent
Kawasaki et al.

(10) Patent No.: US 11,952,675 B2
(45) Date of Patent: Apr. 9, 2024

(54) SURFACE-TREATED COPPER FOIL AND METHOD FOR MANUFACTURING SAME

(71) Applicant: NIPPON DENKAI, LTD., Chikusei (JP)

(72) Inventors: Toshio Kawasaki, Chikusei (JP); Yasuhiro Endo, Chikusei (JP)

(73) Assignee: NIPPON DENKAI, LTD., Chikusei (JP)

(*) Notice: Subject to any disclaimer, the term of this patent is extended or adjusted under 35 U.S.C. 154(b) by 189 days.

(21) Appl. No.: 17/787,847

(22) PCT Filed: Nov. 10, 2020

(86) PCT No.: PCT/JP2020/041840
§ 371 (c)(1),
(2) Date: Jun. 21, 2022

(87) PCT Pub. No.: WO2021/131359
PCT Pub. Date: Jul. 1, 2021

(65) Prior Publication Data
US 2023/0043755 A1    Feb. 9, 2023

(30) Foreign Application Priority Data
Dec. 24, 2019   (JP) .................. 2019-232813

(51) Int. Cl.
| | |
|---|---|
| *C25D 5/12* | (2006.01) |
| *C23C 28/00* | (2006.01) |
| *C25D 5/00* | (2006.01) |
| *C25D 5/16* | (2006.01) |
| *C25D 5/48* | (2006.01) |
| *C25D 7/06* | (2006.01) |
| *H05K 1/09* | (2006.01) |
| *H05K 3/38* | (2006.01) |

(52) U.S. Cl.
CPC ............. *C25D 5/12* (2013.01); *C23C 28/30* (2013.01); *C25D 5/16* (2013.01); *C25D 5/48* (2013.01); *C25D 5/605* (2020.08); *C25D 7/0614* (2013.01); *H05K 1/09* (2013.01); *H05K 3/384* (2013.01); *Y10T 428/12438* (2015.01)

(58) Field of Classification Search
None
See application file for complete search history.

(56) References Cited

U.S. PATENT DOCUMENTS

| | | |
|---|---|---|
| 2005/0175826 A1 | 8/2005 | Suzuki |
| 2020/0029444 A1 | 1/2020 | Uno et al. |
| 2020/0141017 A1* | 5/2020 | Sung .................. B32B 3/30 |

FOREIGN PATENT DOCUMENTS

| | | | |
|---|---|---|---|
| JP | 2005248323 A | | 9/2005 |
| JP | 4391437 B2 | * | 12/2009 |
| JP | 2011179078 A | | 9/2011 |
| JP | 2014133936 A | | 7/2014 |
| JP | 5728118 B1 | | 4/2015 |
| WO | 2013147116 A1 | | 10/2013 |
| WO | 2015033917 A1 | | 3/2015 |
| WO | 2017179416 A1 | | 10/2017 |
| WO | 2018110579 A1 | | 6/2018 |
| WO | 2018181726 A1 | | 10/2018 |
| WO | WO-2020031721 A1 | * | 2/2020 ............ C25D 1/04 |

OTHER PUBLICATIONS

"Communication with Supplementary European Search Report", EP Application No. 20904802.4, Dec. 12, 2022, 5 pp.
"International Search Report and English language translation", International Application No. PCT/JP2020/041840, dated Jan. 26, 2021, 5 pp.

* cited by examiner

*Primary Examiner* — Seth Dumbris
(74) *Attorney, Agent, or Firm* — Myers Bigel, P.A.

(57) ABSTRACT

Provided is a surface-treated copper foil in which in order to avoid failures of electronic parts by corrosion, a high bond strength between an electrolytic copper foil and a resin base material can be maintained even when the surface-treated copper foil is exposed to corrosive gases and microparticles, and a method for manufacturing the same. The surface-treated copper foil of the present invention comprises an electrolytic copper foil, a roughened layer covering at least one surface side of the electrolytic copper foil, and a rust preventive layer further covering the roughened layer, wherein the rust preventive layer is at least one surface of the surface-treated copper foil; the rust preventive layer comprises at least a nickel layer; and the thickness of the nickel layer is 0.8 to 4.4 $g/m^2$ in terms of mass per unit area of nickel; and the noncontact roughness Spd of the rust preventive layer is 1.4 to 2.6 peaks/$\mu m^2$ and the surface roughness RzJIS of the rust preventive layer is 1.0 to 2.5 $\mu m$. The method for manufacturing the surface-treated copper foil forms the roughened layer having higher roughnesses than the noncontact roughness Spd and surface roughness RzJIS on one surface of the electrolytic copper foil, and thereafter forming the rust preventive layer meeting the predetermined condition.

6 Claims, No Drawings

SURFACE-TREATED COPPER FOIL AND METHOD FOR MANUFACTURING SAME

RELATED APPLICATIONS

This application is a 35 U.S.C. § 371 national stage application of PCT Application No. PCT/JP2020/041840, filed on Nov. 10, 2020, which itself claims priority to Japanese Patent Application No. 2019-232813, filed on Dec. 24, 2019, the contents of which are incorporated herein by reference in their entireties. The above-referenced PCT International Application was published in the Japanese language as International Publication No. WO 2021/131359 A1 on Jul. 1, 2021.

TECHNICAL FIELD

The present invention relates to a surface-treated copper foil and to a method for manufacturing the same, and in particular, relates to a surface-treated copper foil for negative electrode current collectors of secondary batteries such as lithium ion batteries and for printed wiring boards, and to a method for manufacturing the same.

BACKGROUND ART

In recent years, electrolytic copper foils, which are better for mass production and are relatively lower in production costs than rolled copper foils, are used in various fields including secondary batteries such as lithium ion batteries, and printed wiring boards. In particular, in secondary batteries such as lithium ion batteries, the electrolytic copper foils are suitably used as a material of negative electrode current collectors. Reasons include that the adhesivity with a negative electrode active material constituted of carbon and the like is high; production costs are low and productivity is high, as mentioned previously; and it is easy to make the foil layer thin. Furthermore, mobile terminals such as smartphones have become common, and performance enhancement and reduction in size of electronic devices are progressing in parallel and are accelerating. Furthermore, the diffusion of wearable products and IoT is also progressing, so much greater density enhancement of printed wiring boards is demanded. The density enhancement is caused not only by miniaturization of electronic parts including semiconductors, but also by improvement of wiring density owing to micronization (fine patternization) of printed wiring boards.

In the case of using electrolytic copper foils in the above-mentioned applications, the improvement of the adhesivity with resin base materials is demanded. For example, in Patent Document 1, there is described a surface-treated copper foil having a surface-treated film containing at least a roughening-treated surface having roughening particles formed on at least one surface of the electrolytic copper foil. It is described that on the surface of the surface-treated film of the surface-treated copper foil, the standard deviation of particle heights of the roughening particles is made to be 0.16 μm or greater and 0.30 μm or less, and the average value of ratios (particle height/particle width) of the particle heights of the roughening particles to particle widths the roughening particles is made to be 2.30 or greater and 4.00 or less.

REFERENCE DOCUMENT LIST

Patent Documents

Patent Document 1: WO 2018/181726 A1

SUMMARY OF THE INVENTION

Problem to be Solved by the Invention

Society is becoming one in which IoT applications progress and everything, such as clothes (wearable devices), automobiles (smart cars) and houses (smart houses), is made smart by the Internet, conventionally to which IT-related devices such as personal computers and servers are connected, and terminals and things have become independently cooperative, with human intervention unnecessary. Along therewith, the speed-up and capacity increase of communication systems rapidly advance and the demand for the performance required for communication parts and the like is greatly increasing.

For such information communication devices, printed wiring boards are used. A printed wiring board is usually finished by heating and pressing copper foils which become electric circuitry and a substrate composed of an insulator such as a resin to fabricate a copper clad laminate, and thereafter, forming the circuitry by etching and further mounting electronic parts.

On the other hand, failures of electronic devices against requirements for serviceableness, comfortableness and the like lead to loss of information, and one of the main causes of failure is corrosion of electronic parts caused by a high relative humidity and corrosive gases and microparticles. There increases the time for users to use, for example, smartphones, wearable products and the like outdoors and in cars, and there are increasing occasions for these devices to be exposed to a high relative humidity and corrosive gases, encouraging the deterioration of IoT devices such as smartphones and wearable products. Then, although corrosion prevention is carried out by subjecting copper foil surfaces to chromate treatment, not using chromium is desired from the viewpoint of concern for the environment.

Accordingly, the present invention has as an object to provide a surface-treated copper foil in which a high bond strength between an electrolytic copper foil and a resin base material can be retained even when the surface-treated copper foil is exposed to corrosive gases and microparticles in order to avoid such failures by corrosion, and a method for manufacturing the same.

Means for Solving the Problem

In order to achieve the object, one aspect of the present invention is the surface-treated copper foil, the surface-treated copper foil comprising an electrolytic copper foil, a roughened layer covering at least one surface side of the electrolytic copper foil, and a rust preventive layer further covering the roughened layer, wherein the rust preventive layer is at least one surface of the surface-treated copper foil; the rust preventive layer comprises at least a nickel layer; the thickness of the nickel layer is 0.8 to 4.4 g/m$^2$ in terms of mass per unit area of nickel; and the noncontact roughness Spd of the rust preventive layer is 1.4 to 2.6 peaks/μm$^2$ and the surface roughness RzJIS of the rust preventive layer is 1.0 to 2.5 μm.

The rust preventive layer, as required, may further comprise a chromate-treated layer and/or a silane coupling agent-treated layer.

It is preferable that the surface-treated copper foil further comprise a composite metal layer of copper with at least one or more metals selected from molybdenum, zinc, tungsten, nickel, cobalt and iron, between the electrolytic copper foil and the roughened layer.

Another aspect of the present invention is a method for manufacturing the surface-treated copper foil, the method comprising: a roughening treatment step of forming a roughened layer on at least one surface of a electrolytic copper foil wherein the noncontact roughness Spd of the roughened layer is made to be more than 2.6 peaks/μm$^2$ and the surface roughness RzJIS of the rust preventive layer is made to be higher than 2.5 μm; and a rust preventive treatment step of forming at least a nickel layer as a rust preventive layer on the roughened layer wherein the thickness of the nickel layer is made to be 0.8 to 4.4 g/m$^2$ in terms of mass per unit area of nickel and the noncontact roughness Spd of the rust preventive layer is made to be 1.4 to 2.6 peaks/μm$^2$ and the surface roughness RzJIS of the rust preventive layer is made to be 1.0 to 2.5 μm.

The rust preventive treatment step may further comprise, in addition to the formation of the nickel layer, as required, a chromate treatment and/or a silane coupling agent treatment.

It is preferable that before the roughening treatment step, the method further comprises a step of forming a composite metal layer on the surface of the electrolytic copper foil on which the roughened layer is to be formed, by a plating bath containing copper and one or more metals selected from molybdenum, zinc, tungsten, nickel, cobalt, and iron.

Effects of the Invention

According to the present invention, by thus forming the rust preventive layer comprising at least the nickel layer on the roughened layer on at least one surface of the electrolytic copper foil, making the thickness of the nickel layer to be 0.8 to 4.4 g/m$^2$ in terms of mass per unit area of nickel, and making the noncontact roughness Spd of the rust preventive layer to be 1.4 to 2.6 peaks/μm$^2$ and the surface roughness RzJIS of the rust preventive layer to be 1.0 to 2.5 μm, when the surface-treated copper foil is used in applications such as secondary batteries and printed wiring boards, the bond strength between the rust preventive layer of the surface-treated copper foil and a resin base material provided on the rust preventive layer can be made high and a high bond strength can be retained even when the surface-treated copper foil is exposed to corrosive gases and microparticles.

MODE FOR CARRYING OUT THE INVENTION

Hereinafter, embodiments of the electrolytic copper foil and a method for manufacturing the same according to the present invention will be described. The present invention is not limited to embodiments described below, however.

Surface-Treated Copper Foil

A surface-treated copper foil of the present embodiment comprises an electrolytic copper foil, a roughened layer covering at least one surface side of the electrolytic copper foil, and a rust preventive layer further covering the roughened layer, wherein the rust preventive layer is at least one surface of the surface-treated copper foil; and the noncontact roughness Spd of the rust preventive layer is 1.4 to 2.6 peaks/μm$^2$ and the surface roughness RzJIS of the rust preventive layer is 1.0 to 2.5 μm.

The noncontact roughness Spd is measured according to ISO 25178. The noncontact roughness Spd represents the number (unit: number of peaks/μm$^2$) of peak points per unit area, and it is meant that the larger this numerical value is, the greater the number of contact points with another object contacting with the surface is. The lower limit of the noncontact roughness Spd is preferably 1.5 peaks/μm$^2$ or more and more preferably 1.7 peaks/μm$^2$ or more. The upper limit of the noncontact roughness Spd is preferably 2.2 peaks/μm$^2$ or less and more preferably 2.0 peaks/μm$^2$ or less.

The surface roughness RzJIS is measured according to JIS B0601:1994. The surface roughness RzJIS is a parameter also called "10-point average roughness (in JIS B0601:2013, Rzjis94"), and is determined as a value (unit: μm) obtained by adding an average of peak heights from the highest peak to the 5th highest peak and an average of valley bottom depths from the deepest bottom to the 5th deepest bottom, in a contour curve in a sampling length obtained by applying a phase compensating wideband filter having a cutoff value of λc. The lower limit of the surface roughness RzJIS is preferably 1.1 μm or higher and more preferably 1.3 μm or higher. The upper limit of the surface roughness RzJIS is preferably 2.1 μm or lower and more preferably 1.9 μm or lower.

By thus evaluating the surface of the rust preventive layer by two parameters of the noncontact roughness Spd and the surface roughness RzJIS, since there are found the magnitude of irregularities in the normal direction of the surface of the rust preventive layer and the frequency of the irregularities on the plane, the bond strength with a resin base material is enabled to be presumed from the anchor effect on the resin base material by such irregularities of the rust preventive layer. Then, by setting the two parameters of the noncontact roughness Spd and the surface roughness RzJIS of the surface of the rust preventive layer of the surface-treated copper foil of the present embodiment to satisfy the predetermined ranges, respectively, the thickness of the rust preventive layer covering the roughened layer is also enabled to be presumed, and thereby, there can be formed the rust preventive layer having a thickness capable of sufficiently withstanding corrosive gases and microparticles.

The bond strength of the surface-treated copper foil can be measured according to JIS C6481. Specifically, an FR-5-equivalent glass epoxy resin-impregnated base material is laminated on the surface of the rust preventive layer of the surface-treated copper foil to make a copper clad laminate; and the surface-treated copper foil is peeled in the perpendicular direction from the resin base material of the copper clad laminate under predetermined conditions, and the lowest value (unit: kN/m) of loads at this time is taken as a bond strength (peeling strength). The bond strength of the surface-treated copper foil is retained, even after the surface-treated copper foil is exposed to corrosive gases and microparticles, preferably at 0.70 kN/m or higher, more preferably 0.73 kN/m or higher and still more preferably 0.75 kN/m or higher.

It is preferred that the material of the rust preventive layer be nickel, from the viewpoint of tolerance to corrosive gases and microparticles. It is also preferred that the thickness of the nickel layer of the rust preventive layer be made to be 0.8 to 4.4 g/m$^2$ in terms of mass per unit area of nickel. Though depending on the noncontact roughness Spd and the surface roughness RzJIS of the roughened layer the rust preventive layer covers, by setting the thickness of the nickel layer of the rust preventive layer to the range, the noncontact roughness Spd and the surface roughness RzJIS of the rust preventive layer can be made to satisfy the ranges. The lower limit of the thickness of the nickel layer of the rust preventive layer is, in terms of mass per unit area of nickel, preferably 1.0 g/m² or higher and more preferably 1.5 g/m² or higher. Then, the upper limit of the thickness of the nickel layer of the rust preventive layer is, in terms of mass per unit area of nickel, preferably 4.0 g/m² or lower and more preferably 3.0 g/m² or higher.

The thickness of the nickel layer of the rust preventive layer can be measured by atomic absorption spectrometry, radio-frequency inductively coupled plasma (ICP) emission spectrometry, X-ray fluorescence analysis, weight measurement or the like.

The rust preventive layer may be formed of a plurality of layers. The rust preventive layer may further be formed of, in addition to the nickel layer, for example, a chromate-treated layer or a silane coupling agent-treated layer formed by chromate treatment or silane coupling agent treatment on the roughened layer side or the surface side of the nickel layer.

The material of the roughened layer, in order to retain the conductivity, is preferably copper but may be a metal of tungsten, molybdenum, nickel, cobalt, iron or zinc, or a composite metal composed of two or more these metals. The thickness of the roughened layer is preferably 0.7 to 2.0 μm.

The thickness of the electrolytic copper foil is preferably 6 to 35 μm. When the thickness is less than 6 μm, handleability of the electrolytic copper foil becomes difficult in some cases. On the other hand, when the thickness is greater than 18 μm, there occur some cases in which when the electrolytic copper foil is used in applications such as secondary batteries and printed wiring boards, the battery capacity is lowered due to the decrease of the winding number, and a disadvantage is brought about on the formation of fine patterns. The lower limit of the thickness of the electrolytic copper foil is more preferably 6 μm or greater and still more preferably 8 μm or greater. The upper limit of the thickness of the electrolytic copper foil is more preferably 35 μm or smaller and still more preferably 18 μm or smaller.

The electrolytic copper foil has a cathode surface which is shiny, which is the side having contacted with an electrodepositing drum in its production process, and a deposition surface formed by plating on the opposite side thereto. The roughened layer and rust preventive layer may be formed on both sides of the cathode surface and the deposition surface of the electrolytic copper foil, or may be formed on either one of the surfaces; and in the case of it being on one surface, it is preferred that the roughened layer and rust preventive layer be formed on the deposition surface of the electrolytic copper foil.

The surface-treated copper foil of the present embodiment, as required, may comprise a composite metal layer between the electrolytic copper foil and the roughened layer. The material of the composite metal layer is preferably a composite metal of copper with one or more metals selected from molybdenum, zinc, tungsten, nickel, cobalt and iron, and more preferably a composite metal of copper with one or more metals selected from tungsten and molybdenum and one or more metals selected from nickel, cobalt, iron and zinc. By providing such a composite metal layer between the electrolytic copper foil and the roughened layer, there is brought about an advantage of being capable to uniformly form an acicular or granular copper-plated layer on the copper foil surface.

Method for Manufacturing Surface-Treated Copper Foil

There will be described hereinafter an embodiment of a method for manufacturing the above-mentioned surface-treated copper foil. The method for manufacturing the surface-treated copper foil of the present embodiment comprises mainly a roughening treatment step and a rust preventive treatment step.

The roughening treatment step is a step of plating both surfaces or one surface of the electrolytic copper foil to form the roughened layer. Thereby, both the surfaces or the one surface is roughened, and for example, the noncontact roughness Spd of the roughened layer can be made to be more than 2.6 peaks/μm²; and the surface roughness Rz of the rust preventive layer can be made to be higher than 2.5 μm. Depending on the rust preventive layer to be formed thereafter, it may be that the noncontact roughness Spd is made to be more than 2.2 peaks/μm²; and the surface roughness Rz, to be higher than 2.1 μm; and it may also be that the noncontact roughness Spd is made to be more than 2.0 peaks/μm²; and the surface roughness Rz, to be higher than 1.9 μm. In order to form such a roughened layer, it is preferred to use an acidic copper plating bath; and a specific plating bath composition and plating condition can be made to be: for example, a concentration of copper sulfate of 130 to 150 g/L, a concentration of sulfuric acid of 80 to 120 g/L, a bath temperature of 25 to 35° C., a current density of 1 to 3 A/dm², and a treatment time of 10 to 30 s. As the roughening treatment of the electrolytic copper foil, there may be used, for example, a method of using an acidic copper plating bath disclosed in JP No. 53-39376 B, that is, a method of forming a dendritic copper plated layer by using an acidic copper plating bath at a current of not less than a limiting current density, and thereafter carrying out coating plating at a current less than a limiting current density.

Although the plating bath composition and plating condition are for the case of forming the roughened layer of copper, as described later, also in the case in which a composite metal layer is previously formed on the surface of the electrolytic copper foil before the roughening treatment, the roughening treatment can be carried out by using the similar acidic copper plating bath as above-mentioned. Here, it is preferred that in the roughening treatment step, before the plating, be carried out on the electrolytic copper foil, the electrolytic copper foil is previously water washed or acid cleaned.

The rust preventive treatment step is a step of plating the roughened layer formed on both surfaces or one surface of the electrolytic copper foil to form the rust preventive layer thereon. Thereby, the roughened layer is covered with the rust preventive layer and the noncontact roughness Spd of the rust preventive layer can be made to be 1.4 to 2.6 peaks/μm² and the surface roughness RzJIS of the rust preventive layer can be made to be 1.0 to 2.5 μm. It is especially preferred that the noncontact roughness Spd of the rust preventive layer be made to be 1.7 to 2.0 peaks/μm² and the surface roughness RzJIS of the rust preventive layer be made to be 1.3 to 1.9 μm. The plating bath composition and the plating condition in order to form such a rust preventive layer can be made to be: for example, a concentration of nickel sulfate of 300 to 500 g/L, a concentration of boric acid of 30 to 50 g/L, a bath temperature of 40 to 60° C., a current density of 5 to 15 A/dm², and a treatment time of 4 to 17 s. The thickness of the rust preventive layer of nickel formed thereby can be made to be 0.8 to 4.4 g/m² in terms of mass per unit area of nickel.

Then, in the rust preventive treatment step, it is preferred that before the plating of the surface of the roughened layer of the electrolytic copper foil, the surface be previously water washed. Furthermore, in the rust preventive treatment step, as mentioned above, in addition to the formation of the nickel layer, a chromate treatment or a silane coupling agent treatment may be combined, as required. To the treatment condition of the chromate treatment or the silane coupling agent treatment, a well-known treatment condition carried out for electrolytic copper foils can be applied.

The method for manufacturing the surface-treated copper foil of the present embodiment may comprise, as required, before the roughening treatment step, a step of, forming the composite metal layer on the surface of the electrolytic copper foil on which the roughened layer is to be formed. In order to form the composite metal layer, it is preferred to use a plating bath containing the metal ions of the above-mentioned material of the composite metal layer. The specific plating bath composition and plating condition in order to form the composite metal layer of, for example, copper, molybdenum and zinc can be made to be; for example, a concentration of copper sulfate of 40 to 60 g/L, a concentration of sodium molybdate of 1 to 3 g/L, a concentration of zinc sulfate of 40 to 60 g/L, a pH of 2 to 3, a bath temperature of 25 to 35° C., a current density of 2 to 8 A/dm$^2$ and a treatment time of 2 to 8 s. Then in order to form the roughened layer after the formation of the composite metal layer, there may also be used, for example, a production method of a roughening-treated copper foil disclosed in JP Patent No. 3949871, that is, a method of forming a composite metal layer by using a plating bath containing the metal ions of the composite metal layer at a current of less than a limiting current density of the bath, and thereafter carrying out coating plating with an acidic copper plating bath.

Then, in the step of forming the composite metal layer, it is preferred that before the plating of the electrolytic copper foil, the electrolytic copper foil be previously water washed or acid cleaned.

EXAMPLES

Hereinafter, the present invention will be described in more detail by way of Examples of the present invention and Comparative Examples. The present invention, however, is not limited to the following Examples.

Example 1

(1) Production of a surface-treated copper foil

First, an electrolytic copper foil (Nippon Denkai, Ltd., item number: SEED Foil) of 12 μm in thickness was subjected to acid cleaning treatment with a 10% sulfuric acid for 20 s. Then, the electrolytic copper foil was water washed; and both surfaces of the electrolytic copper foil were plated by using a plating bath containing copper sulfate pentahydrate at 50 g/L, sodium molybdate dihydrate at 2 g/L and zinc sulfate heptahydrate at 50 g/L, where a pH thereof is regulated to 2.5 and a bath temperature thereof is regulated to 30° C. to thereby form composite metal layers containing copper, molybdenum and zinc.

Then, the resultant copper foil was water washed; and both surfaces of the resultant copper foil were plated by using a plating solution containing copper sulfate pentahydrate at 130 g/L and sulfuric acid at 100 g/L, where a bath temperature thereof is regulated to 30° C. at a current density of 2 A/dm$^2$ for a treatment time of 20 s to thereby form roughened layers composed of copper on the composite metal layers.

Furthermore, the resultant copper foil was water washed; and both surfaces of the resultant copper foil were plated by using a plating solution containing nickel sulfate hexahydrate at 400 g/L and boric acid at 40 g/L, where a bath temperature thereof is regulated to 50° C. at a current density of 10 A/dm$^2$ for a treatment time of 4 s to form rust preventive layers composed of nickel to thereby obtain a surface-treated copper foil (Example 1).

(2) Tests for properties of the surface-treated copper foil

For the surface-treated copper foil thus obtained, the amount of nickel per unit area of the rust preventive layer was measured based on X-ray fluorescence analysis using a wave-length dispersive X-ray fluorescence spectrometric analyzer (Rigaku Corp., ZSX Primus II). The results are shown in Table 1.

Then, in order to measure the bond strength of the surface-treated copper foil, an FR-5-equivalent glass epoxy resin-impregnated base material was laminated on one surface of the surface-treated copper foil to make a copper clad laminate to thereby fabricate a test piece. The bond strength between the surface-treated copper foil and the resin base material of the test piece was measured (copper foil width: 1 mm) at room temperature according to JIS C6481. Here, the bond strength was measured for the test piece in the state before treatment (normal state) of being immersed in a hydrochloric acid solution (concentration: 18%), and for the test piece in the state after the treatment (after the hydrochloric acid immersion). The measurement of the bond strength was carried out by a tensile tester (Toyo Seiki Seisaku-sho Ltd., Strograph E3-L). The results are shown in Table 1.

Furthermore, the noncontact roughness Spd of the surface-treated copper foil was measured according to ISO 25178; and the surface roughness RzJIS of the surface-treated copper foil was measured according to JIS B0601: 1994. Here, the measurements of the noncontact roughness Spd and the surface roughness RzJIS were carried out by a laser microscope device (Keyence Corp., VK-X150). The results are shown in Table 1.

Example 2

A surface-treated copper foil was manufactured and subjected to the respective property tests as in Example 1, except for forming rust preventive layers composed of nickel by plating the resultant copper foil by using a plating solution containing nickel sulfate hexahydrate at 400 g/L and boric acid at 40 g/L, where a bath temperature thereof is regulated to 50° C. at a current density of 10 A/dm$^2$ for a treatment time of 8 s, in manufacture of the surface-treated copper foil. The results are shown in Table 1.

Example 3

A surface-treated copper foil was manufactured and subjected to each property test as in Example 1, except for forming rust preventive layers composed of nickel by plating the resultant copper foil by using a plating solution containing nickel sulfate hexahydrate at 400 g/L and boric acid at 40 g/L, where a bath temperature thereof is regulated to 50° C. at a current density of 10 A/dm$^2$ for a treatment time of 12 s, in manufacture of the surface-treated copper foil. The results are shown in Table 1.

Example 4

A surface-treated copper foil was produced and subjected to each property test as in Example 1, except for forming rust preventive layers composed of nickel by plating the resultant copper foil by using a plating solution containing nickel sulfate hexahydrate at 400 g/L and boric acid at 40 g/L, where a bath temperature thereof is regulated to 50° C. at a current density of 10 A/dm$^2$ for a treatment time of 17 s, in manufacture of the surface-treated copper foil. The results are shown in Table 1.

Comparative Example 1

A surface-treated copper foil was manufactured and subjected to each property test as in Example 1, except for forming rust preventive layers by immersing the resultant copper foil in an aqueous solution containing sodium dichromate dihydrate at 3.5 g/L, where a pH thereof is regulated to 5.3 and a bath temperature thereof is regulated to 28° C. for 10 s, in manufacture of the surface-treated copper foil. The results are shown in Table 1.

Comparative Example 2

A surface-treated copper foil was manufactured and subjected to each property test as in Example 1, except for forming rust preventive layers composed of nickel by plating the resultant copper foil by using a plating solution containing nickel sulfate hexahydrate at 400 g/L and boric acid at 40 g/L, where a bath temperature thereof is regulated to 50° C. at a current density of 10 A/dm$^2$ for a treatment time of 1 s, in manufacture of the surface-treated copper foil. The results are shown in Table 1.

Comparative Example 3

A surface-treated copper foil was produced and subjected to each property test as in Example 1, except for forming rust preventive layers composed of nickel by plating the resultant copper foil by using a plating solution containing nickel sulfate hexahydrate at 400 g/L and boric acid at 40 g/L, where a bath temperature thereof is regulated to 50° C. at a current density of 10 A/dm$^2$ for a treatment time of 2 s, in manufacture of the surface-treated copper foil. The results are shown in Table 1.

Comparative Example 4

A surface-treated copper foil was manufactured and subjected to each property test as in Example 1, except for forming rust preventive layers composed of nickel by plating the resultant copper foil by using a plating solution containing nickel sulfate hexahydrate at 400 g/L and boric acid at 40 g/L, where a bath temperature thereof is regulated to 50° C. at a current density of 10 A/dm$^2$ for a treatment time of 20 s, in manufacture of the surface-treated copper foil. The results are shown in Table 1.

Comparative Example 5

A surface-treated copper foil was manufactured and subjected to each property test as in Example 1, except for forming rust preventive layers composed of nickel by plating the resultant copper foil by using a plating solution containing nickel sulfate hexahydrate at 400 g/L and boric acid at 40 g/L, where a bath temperature thereof is regulated to 50° C. at a current density of 10 A/dm$^2$ for a treatment time of 40 s, in manufacture of the surface-treated copper foil. The results are shown in Table 1.

Comparative Example 6

A surface-treated copper foil was manufactured and subjected to each property test as in Example 1, except for forming rust preventive layers composed of nickel by plating the resultant copper foil by using a plating solution containing nickel sulfate hexahydrate at 400 g/L and boric acid at 40 g/L, where a bath temperature thereof is regulated to 50° C. at a current density of 10 A/dm$^2$ for a treatment time of 2 s, and further laminating rust preventive layers by immersing the resultant copper foil in an aqueous solution containing sodium dichromate dihydrate of 3.5 g/L, where a pH thereof is regulated to 5.3 and a bath temperature thereof is regulated to 28° C. for 10 s, in manufacture of the surface-treated copper foil. The results are shown in Table 1.

TABLE 1

| No. | Ni amount [g/m$^2$] | Bond strength (normal state) (FR-5) [kN/m] | Bond strength (after hydrochloric acid immersion) (FR-5) [kN/m] | Noncontact roughness Spd [peaks/μm$^2$] | Surface roughness RzJIS [μm] |
|---|---|---|---|---|---|
| Example 1 | 1 | 0.77 | 0.76 | 1.98 | 1.80 |
| Example 2 | 2 | 0.81 | 0.80 | 1.84 | 1.72 |
| Example 3 | 3 | 0.76 | 0.75 | 1.75 | 1.69 |
| Example 4 | 4.3 | 0.75 | 0.74 | 1.71 | 1.85 |
| Comparative Example 1 | 0 | 0.67 | 0.61 | 2.10 | 2.09 |
| Comparative Example 2 | 0.25 | 0.66 | 0.53 | 2.09 | 2.11 |
| Comparative Example 3 | 0.5 | 0.69 | 0.52 | 2.07 | 2.05 |
| Comparative Example 4 | 5 | 0.23 | 0.22 | 1.68 | 1.28 |
| Comparative Example 5 | 10 | 0.06 | 0.06 | 1.65 | 1.23 |
| Comparative Example 6 | 0.25 | 0.69 | 0.61 | 1.82 | 1.73 |

As shown in Table 1, the surface-treated copper foils of Examples 1 to 4, in which the amount of nickel of the rust preventive layer was 0.8 to 4.4 g/m$^2$, and the surface noncontact roughness Spd of the rust preventive layer was 1.7 to 2.0 peaks/μm$^2$ and the surface roughness RzJIS of the rust preventive layer was 1.3 to 1.9 μm, had a bond strength with the resin base material of 0.70 kN/m or higher for both in the normal state and after the hydrochloric acid immersion, so that it was confirmed that the bond strength was excellent in resisting corrosive gases was able to be retained.

In contrast, in Comparative Example 1, which had the rust preventive layer formed only of chromate treatment, the bond strength near to those in Examples was exhibited in the normal state, but after the hydrochloric acid immersion, the bond strength decreased to about 0.6 kN/m, so that it was confirmed that the influence by corrosion was large. Then, the surface-treated copper foils of Comparative Examples 2 and 3, in which the amount of nickel of the rust preventive layer was less than 0.8, and the surface noncontact roughness Spd of the rust preventive layer was more than 2.0 peaks/$\mu m^2$, and the surface roughness RzJIS of the rust preventive layer was higher than 1.9 $\mu m$, had a bond strength near to those in Examples exhibited in the normal state, but after the hydrochloric acid immersion, the bond strength decreased even by 0.1 kN/m or higher, so that it was confirmed that the effects of corrosion were very large.

The surface-treated copper foils of Comparative Examples 4 and 5, in which the amount of nickel of the rust preventive layer was greater than 4.4 g, the surface noncontact roughness Spd of the rust preventive layer was less than 1.7 peaks/$\mu m^2$ and the surface roughness RzJIS of the rust preventive layer was less than 1.3 $\mu m$, could not exhibit a sufficient bond strength, since the bond strength with the resin base material became a remarkably low value for both in the normal state and after the hydrochloric acid immersion. The surface-treated copper foil of Comparative Example 6 having the rust preventive layer formed of two layers of the nickel layer and the chromate-treated layer had a surface noncontact roughness Spd of the rust preventive layer of 1.7 to 2.0 peaks/$\mu m$ and a surface roughness RzJIS of the rust preventive layer of 1.3 to 1.9 $\mu m$; however, the nickel amount was less than 0.8, thus the bond strength with the resin base material exhibited a bond strength near those in Examples in the normal state, but after the hydrochloric acid immersion, the bond strength decreased to about 0.6 kN/m, so that it was confirmed that the effects of corrosion were large.

The invention claimed is:

1. A surface-treated copper foil comprising:
   an electrolytic copper foil;
   a roughened layer covering at least one surface side of the electrolytic copper foil; and
   a rust preventive layer further covering the roughened layer,
   wherein the rust preventive layer is at least one surface of the surface-treated copper foil; the rust preventive layer comprises at least a nickel layer; and a thickness of the nickel layer is 0.8 to 4.4 g/$m^2$ in terms of mass per unit area of nickel; and
   a noncontact roughness Spd of the rust preventive layer is 1.4 to 2.6 peaks/$\mu m^2$ and a surface roughness RzJIS of the rust preventive layer is 1.0 to 2.5 $\mu m$.

2. The surface-treated copper foil according to claim 1, wherein the rust preventive layer further comprises a chromate-treated layer and/or a silane coupling agent-treated layer.

3. The surface-treated copper foil according to claim 1, wherein the surface-treated copper foil further comprises a composite metal layer of copper with at least one or more metals selected from molybdenum, zinc, tungsten, nickel, cobalt and iron, between the electrolytic copper foil and the roughened layer.

4. A method for manufacturing a surface-treated copper foil, comprising:
   a roughening treatment step of forming a roughened layer on at least one surface of an electrolytic copper foil wherein a noncontact roughness Spd of the roughened layer is made to be more than 2.6 peaks/$\mu m^2$ and a surface roughness RzJIS of the rust preventive layer is made to be greater than 2.5 $\mu m$; and
   a rust preventive treatment step of forming at least a nickel layer as a rust preventive layer on the roughened layer wherein a thickness of the nickel layer is made to be 0.8 to 4.4 g/$m^2$ in terms of mass per unit area of nickel; and a noncontact roughness Spd of the rust preventive layer is made to be 1.4 to 2.6 peaks/$\mu m^2$ and a surface roughness RzJIS of the rust preventive layer is made to be 1.0 to 2.5 $\mu m$.

5. The method for manufacturing a surface-treated copper foil according to claim 4, wherein the rust preventive treatment step further comprises, in addition to the formation of the nickel layer, a chromate treatment and/or a silane coupling agent treatment.

6. The method for manufacturing a surface-treated copper foil according to claim 4, wherein the method further comprises, before the roughening treatment step, a step of forming a composite metal layer on a surface of the electrolytic copper foil on which the roughened layer is to be formed, by a plating bath containing copper and one or more metals selected from molybdenum, zinc, tungsten, nickel, cobalt and iron.

* * * * *